United States Patent [19]

Buescher et al.

[11] 4,191,577
[45] Mar. 4, 1980

[54] BRAZING SLURRY

[75] Inventors: William E. Buescher, Seneca Falls, N.Y.; Frederick J. Roberto, Emporium; Isabelle M. Sobierajski, St. Marys, both of Pa.

[73] Assignee: GTE Sylvania Incorporated, Stamford, Conn.

[21] Appl. No.: 955,088

[22] Filed: Oct. 26, 1978

[51] Int. Cl.² ............................ C23C 1/12; B23K 35/34
[52] U.S. Cl. ................................. 106/1.12; 106/1.25; 106/193 J; 106/193 M; 148/24; 148/28
[58] Field of Search .................. 106/1.12, 1.25, 193 J, 106/193 M; 148/22, 24, 27, 28

[56] References Cited

U.S. PATENT DOCUMENTS

| 3,623,921 | 11/1971 | Behringer et al. | 148/24 |
| 3,762,965 | 10/1973 | Amin et al. | 148/24 |
| 3,832,242 | 8/1974 | Cuthbert | 148/24 |

Primary Examiner—Lorenzo B. Hayes
Attorney, Agent, or Firm—William H. McNeill

[57] ABSTRACT

A composition for a brazing slurry which will form solid connections below 1600° C. The composition comprises, by weight, about 21% to 22% fine particle tungsten; about 7% to 8% calcium oxide; about 5% to 6% silicon dioxide; about 5% to 6% titanium dioxide; about 3% to 4% aluminum oxide; and about 55.5% to 57.5% of an organic binder.

The composition is well suited to attaching leads to metallized patterns formed on ceramic substrate and can also be employed as the pattern forming material.

4 Claims, 1 Drawing Figure

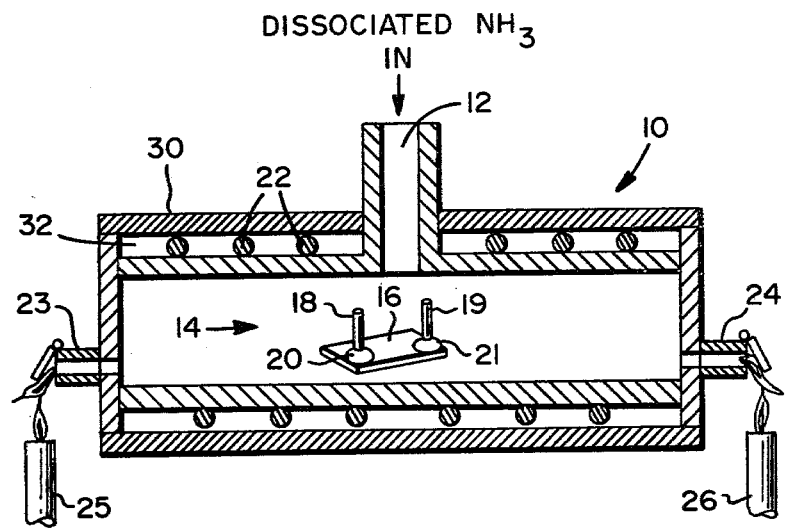

BRAZING SLURRY

TECHNICAL FIELD

This invention relates to brazing slurries suitable for bonding electrical leads to metallized patterns contained on ceramic substrates. The slurry is also advantageously employed for making metallized patterns.

BACKGROUND ART

Prior art brazing slurries have been unsuitable for bonding leads to thin ceramic substrates because of the necessary bonding temperatures involved, namely, 1600° C. or greater, at which temperatures the ceramics have a tendency to warp.

DISCLOSURE OF INVENTION

The instant slurries are specially formulated composition to achieve bonding of electrical leads to metallized patterns on ceramic substrates at temperatures below the warping temperature of the substrate, i.e., temperatures below 1600° C.

The brazing slurry composition comprises, by weight, a substantially homogeneous suspension of about 21.5% fine particle metallic tungsten, about 7.5% calcium oxide, about 5.5% silicon dioxide, about 5.5% titanium dioxide, about 3.5% aluminum oxide and about 56.5% of an organic binder. This slurry will braze well at 1500° C. and will braze at temperatures as low as 1300° C.; however, at the lower limit the wetting action is not as good as at 1500° C.

BRIEF DESCRIPTION OF THE DRAWINGS

The single FIGURE is a diagrammatic view of a furnace employed for achieving a braze with the slurry of the invention.

SBEST MODE FOR CARRYING OUT THE INVENTION

For a better understanding of the present invention reference is made to the following disclosure and appended claims taken in conjunction with the above described drawing.

The brazing slurry of the invention comprises a substantially homogeneous suspension containing, by weight, about 21% to 22% fine particle metallic tungsten, about 7% to 8% calcium oxide, about 5% to 6% silicon dioxide, about 5% to 6% titanium dioxide about 3% to 4% aluminum oxide and about 55.5% to 57.5% of an organic binder.

The organic binder comprises, by weight of the composition, about 43% to 44% ethylene carbonate and about 12.5% to 13.5% ethyl cellulose and has a viscosity of about 312 centipoises.

The brazing slurry is formulated by mixing in a speciman size ball mill, with the organic binder described above, 50 g of fine particle metallic tungsten such as Sylvania Grade M-10 which is available from GTE Sylvania Inc., Towanda, Pennsylvania; 16.5 g calcium oxide; 13.7 g silicon dioxide; 13.1 g titanium dioxide; 6.7 g aluminum oxide, Norton's 38–900 grade or equivalent, 100 g ethylene carbonate, and 30 g of ethyl cellulose.

The suspension is ball milled for 72 hours and has added thereto a specific amount of anhydrol, determined by the final use of the slurry. Thus, if the slurry is to be used for forming conductive patterns to be employed as heater or cathode configurations for an electron tube, 10 ml of anhydrol is added. If the slurry is to be used for brazing, then 20 ml of anhydrol is employed to rinse the mill and form the final consistency.

The completed brazing slurry is best employed for attaching molybdenum leads to conductive coatings formed on thin ceramic substrates, for example, substantially pure sapphire.

Lead attachment is consummated, preferably in an electric furnace 10, such as is illustrated in the figure. Furnace 10 has an inlet 12 for receiving a suitable atmosphere, such as dissociated ammonia. An article 14 being worked upon is shown within the furnace and comprises a ceramic substrate 16 to which leads 18, 19 are being attached by means of the instant brazing slurry, shown at 20, 21.

The furnace is of the type known as a closed tube, controlled atmosphere furnace and is preferably heated by a tungsten coil, 22. The coil 22 is surrounded by a jacket 30 within which is maintained a non-oxidizing atmosphere 32.

Outlet means 23 and 24 are provided at either end of the furnace and are attended by constant flames 25, 26 to consume the escaping exhaust hydrogen. These exhaust flames are also employed to determine the completion of the brazing cycle, which occurs when the binder is completely burned off. (Approximately 10 minutes at 1500° C.) Thus, while organic binder is present in the exhaust, the flames emanating from the furnace will present a bright yellow appearance which changes to an almost invisible blue flame when firing is completed, and the organic binder is burned off.

As noted above, the use of this slurry allows brazing at temperatures below the warping temperature of ceramic substrates and provides an unique advance in the art.

INDUSTRIAL APPLICABILITY

The slurry of the instant invention is ideally suited to use in the electronics industry, and has particular adaptability as a lead connector for ceramic cathodes employed in electron discharge devices such as cathode ray tubes.

We claim:

1. A brazing composition comprising, by weight, a substantially homogeneous suspension of about 21–22% fine particle metallic tungsten; about 7–8% calcium oxide; about 5–6% silicon dioxide; about 5–6% titanium dioxide; about 3–4% aluminum oxide; and about 55.5–57.5% of an organic binder.

2. The composition of claim 1 wherein said organic binder comprises, by weight of said composition, about 43–44% ethylene carbonate and about 12.5–13.5% ethyl cellulose.

3. The composition of claim 2 wherein said binder has a viscosity of about 312 centipoises.

4. The composition of claim 3 comprising 50 grams of said tungsten; 16.5 grams of said calcium oxide; 13.7 grams of said silicon dioxide; 13.1 grams of said titanium dioxide; 6.7 grams of said aluminum oxide; 100 grams of said ethylene carbonate; 30 grams of said ethyl cellulose.

* * * * *